United States Patent [19]

Boulin et al.

[11] Patent Number: 4,595,835

[45] Date of Patent: Jun. 17, 1986

[54] MATERIAL IONIZING DEVICE

[75] Inventors: Yves Boulin, Chilly Mazarin; Jean Cesario, Verrieres le Buisson; Bernard Landeau, Marcoussis, all of France

[73] Assignee: Commissariat a l'Energie Atomique, Paris, France

[21] Appl. No.: 524,828

[22] Filed: Aug. 19, 1983

[30] Foreign Application Priority Data

Aug. 30, 1982 [FR] France ................................ 82 14774

[51] Int. Cl.$^4$ ................................ H01J 37/00

[52] U.S. Cl. ................................ 250/423 R; 250/288

[58] Field of Search .................... 250/423 R, 425, 427, 250/424, 288

[56] References Cited

U.S. PATENT DOCUMENTS 2,682,611 6/1954 Woodward et al. ................ 250/425

3,229,157 1/1966 Stevens et al. .

4,076,982 2/1978 Ritter et al. ......................... 250/288

4,298,795 11/1981 Takeuchi et al. .................. 250/282

FOREIGN PATENT DOCUMENTS 2045097 2/1971 France .

OTHER PUBLICATIONS

Electron Bombardment Ion Source for Isotopic Analysis of Solids; Tyrrell et al; J. Sci. Inst., 1965, vol. 42, pp. 806–807.

*Primary Examiner*—Alfred E. Smith

*Assistant Examiner*—Paul A. Guss

*Attorney, Agent, or Firm*—Scully, Scott, Murphy & Presser

[57] ABSTRACT

Device for ionizing a material, comprising a tube open at its two ends, and wherein first end of the tube is heated to a temperature permitting the ionization of the material, the second end of the tube being kept at a relatively low temperature, so as to produce a temperature gradient between the ends of the tube and wherein the material is introduced into the tube by the second end thereof, whereat the ionization of the material is also checked.

7 Claims, 4 Drawing Figures

MATERIAL IONIZING DEVICE

BACKGROUND OF THE INVENTION

The present invention relates to a device for ionizing a material by heating it to an elevated temperature. Such an ionizing device is more particularly used in mass spectrometers used for measuring the isotopic abundance ratios in a given chemical element. These spectrometers are used in the nuclear field, as well as in geochronology, when it is wished to date samples.

The principle of ionization by heating, or thermoionization, consists of depositing atoms of a chemical element on a very hot metal surface in such a way that they are reevaporated in the form of ions, whilst losing an electron. This phenomenon is generally expressed by the formula:

$$\frac{n^+}{n^o} = K \exp \frac{e(W-\phi)}{kT}, \text{ with}$$

n°: number of neutral atoms evaporated from the hot metal surface, n+: number of atoms which, under the same conditions, are reevaporated in the form of monocharged ions, which surrender an electron to the metal, K: proportionality constant, e: electron charge, W: extraction potential or work function of heated metal (represents the capacity of the metal to trap electrons), $\phi$: first ionization potential of the ionized element (capacity of said element to lose a first electron), k: Boltzmann constant, T: temperature of the metal surface.

This formula shows that the ionization efficiency $n^+/n^\circ$ is an exponential function of $(W-\phi)/T$. The ionization potential $\phi$ and the work function W are respectively representative of the material to be ionized and the heated material, so that the influence of the temperature T is of a determinative nature. In particular, when the difference $W-\phi$ is negative, it is possible to increase the efficiency by increasing the heating of the hot metal surface.

In order to increase the efficiency, the hot metal surface must be made from a material having both a high work function W and a very high melting point. Thus, a refractory metal is chosen from among the group including rhenium, tungsten and tantalum.

The work function W of these metals is between 4.2 and 5.1 V, so that it is necessary to heat the metal surface to the maximum, when the material to be ionized has an ionization potential above said values.

In the present state of the art, solid material ionizing devices utilizing the thermoionization principle generally consist of three tungsten or rhenium tapes or filaments, carried by conductive rods, traversing an insulating support plate. The material to be ionized is deposited on one of these tapes which, with a facing tape, serves to vaporize the material. The third tape, which forms a U with the first two tapes, ensures the actual ionization. To this end, the three tapes are heated by the Joule effect to a maximum teperature of 2500° C.

In the case of such a device, it is very difficult to deposit the material, bearing in mind the very small dimensions and particularly with a view to preventing part of the material being deposited on the other tapes.

Moreover, the tapes must be manually welded to the rods supporting them, which leads to mediocre reproducibility and a high cost price. In addition, the geometrical arrangement of these filaments is such that a small part of the atoms formed strike the intermediate filament ensuring the ionization, so that the ionization efficiency of this device is not very good.

Finally, the use of heating by the Joule effect imposes the presence of support rods constituting heat leaks, which cool the filaments and also lead to a limitation in the cross-section of the latter. In view of this limitation, the filaments break at beyond 2500° C. In addition the temperature limitation also leads to a limitation in the ionization efficiency of the known devices.

It is also pointed out that different types of ionizing devices are used when required for ionizing a solid material (devices described above) and when used for ionizing a gaseous material. In other words, no known device makes it possible to simultaneously ionize a solid material and a gaseous material.

SUMMARY OF THE INVENTION

The present invention relates to a device for ionizing a material by heating to a high temperature and which does not suffer from the disadvantages of the known devices. It is characterized by a high ion yield, the production of an intense ion current during a reasonable period, great simplicity of positioning the material to be ionized when it is solid and the possibility of ionizing solid materials and certain gaseous compounds with the same basic device.

The present invention therefore specifically relates to a device for ionizing a material, wherein it comprises a tube open at its two ends, means for heating a first end of the tube to a temperature permitting the ionization of said material, the second end of the tube being kept at a relatively low temperature, so as to produce a temperature gradient between the said ends of the tube and means for introducing the material into the tube by the second end thereof, said latter means having means for checking the ionization of the material.

When such a device is used in the ionization of a solid material, the means for introducing the material to be ionized into the tube comprises a rod, at one of whose ends has been deposited the material, the means for checking the ionization thereof incorporating means for displacing the rod in a controlled manner within the tube.

In this case, the means for displacing the rod within the tube can in particular comprise a nut-screw system, whereof one of the elements is fixed and the other is integral with the rod.

As a result of the device according to the invention, the solid material can easily be deposited at the end of the rod, either by electrodeposition on a point formed at said end, or by fixing the material to an ion exchange resin ball located in a recess formed at the end of the rod, or by any other means.

When the device according to the invention is used in the ionization of a gaseous material, the means for introducing the material into the rod comprises a nozzle by which the gaseous material is introduced into the second end of the tube, the means for checking the ionization of this material incorporating means for regulating the flow rate at which the material is introduced into the said tube by said connecting tube.

Whatever the state of the material to be ionized, the means for heating the first end of the tube preferably comprises an electron bombardment device incorporating a coil surrounding the first end of the tube, means for supplying electricity to the coil and means for applying a potential difference between the coil and the tube.

In order to increase the thermal gradient along the tube, the latter is preferably mounted by its unheated end on a fixed interchangeable plate made from a conductive material.

BRIEF DESCRIPTION OF THE DRAWINGS

The invention is described in greater detail hereinafter relative to exemplary embodiments and with reference to the attached drawings, wherein show.

DETAILED DESCRIPTION OF THE PREFERRED EMBODIMENTS

Figure 1:
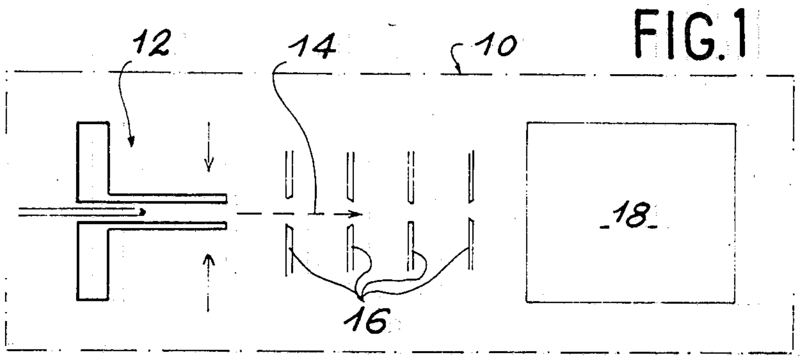
FIG. 1 diagrammatically a mass spectrometer incorporating an ionizing device according to the invention.

FIG. 1 shows in a very diagrammatic manner, a possible application of the invention to a mass spectrometer 10 for measuring the isotopic abundance ratios in a given chemical element. Obviously, this application is exemplary and the invention can be used in all cases where it is wished to have an ionizing device by heating to a high temperature with a high efficiency, no matter what the subsequent use of the ions (e.g. bombardment of another material).

In the mass spectrometer 10 of FIG. 1, the ionizing device 12 according to the invention constitutes a source of ions 14 accelerated and broken by successive electrodes 16, in per se known manner, before traversing the ion sorting and measuring device 18, which is also known.

Figure 2:
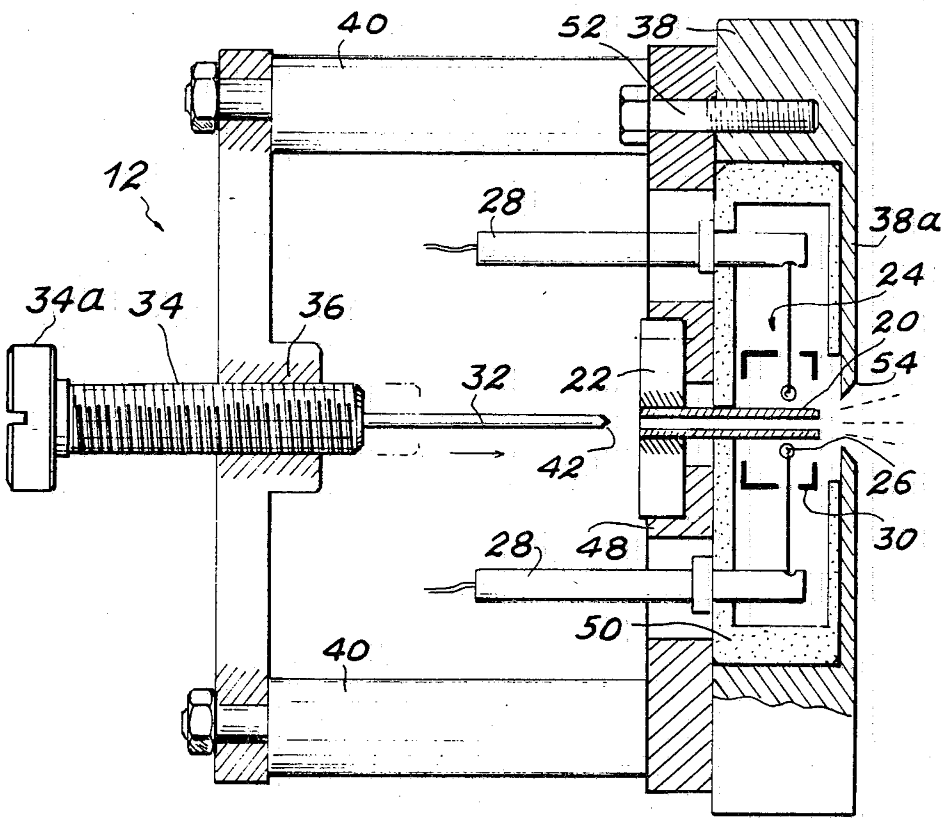
FIG. 2 a larger scale, longitudinal sectional view illustrating a first embodiment of the invention applied to the ionization of a solid material.

If reference is made to FIG. 2, it can be seen that the ionizing device 12 firstly comprises a rectilinear ionizing tube 20, which is open at both ends and which for reasons indicated hereinbefore can be made from any material which is an adequate electricity conductor and which has in the ionization zone a high work function and e.g. it can be made from a refractory metal such as rhenium, tungsten or tantalum. With reference to FIG. 2, the left-hand end of tube 20 is inserted in a plate, wafer or pellet 22 made from a material which is a good conductor of electricity and heat, such as stainless steel. This plate facilitates the handling of the tube and acts as a thermal member, making it possible to maintain the corresponding end of the tubes at a temperature of a few hundred degrees C.

In the vicinity of the opposite end (right-hand end in FIG. 2), tube 20 is heated to a very high temperature, which is slightly below the melting temperature of the tube (i.e. approximately 3000° C., using appropriate heating means 24. On the basis of this local heating, a thermal gradient is produced along tube 20, the heat escaping both by radiation round the tube and conduction along the tube and the plate. If necessary, this thermal gradient can be increased by cooling the left-hand tube with reference to FIG. 2.

Preferably, the heating means 24 is constituted by an electron bombardment device, incorporating a coil 26 surrounding tube 20 in the vicinity of its right-hand end, terminals 28 electrically connected to coil 26 and making it possible to heat the coil by a not shown power supply and not shown means for establishing a high potential difference between coil 26 and tube 20. For example, the electron current emitted by the coil can be 60 mA and the potential difference between the coil and the tube 1000 V. This gives a power of 60 W, making it possible to heat the end of the tube to 3000° C.

A shield, diagrammatically indicated at 30, is preferably provided around tube 20 and coil 26 and can e.g. be in the form of two half-shells.

As the ions must exit via the right-hand end of the tube, as will be shown below, it is clear that the zone in which the heating takes place by means of coil 26 must be located as close as possible to the end, in order to increase the probability that the ions formed leave the tube, i.e. the ion yield of the device. For example, for a tube having an external diameter of 2 mm and an internal diameter of 1.2 mm, the tube is heated at less than 1.5 to 2 mm from its end.

In the application of the invention to the ionization of a solid material shown in FIG. 2, the device also has a cylindrical rectilinear rod 32, positioned coaxially to tube 20 and whose external diameter is slightly less than the internal diameter of the tube. For example, the diameter of rod 32 can be 1 mm, if the internal diameter of the tube 20 is 1.2 mm. The material from which the rod is made must be very pure, refractory, chemically inert and preferably electrically conductive in order to permit the electrodeposition of the material to be ionized. For example, it can be graphite, tantalum or ceramic materials which, if appropriate, are made surface-conductive.

The rod 32 can be moved along its axis, to permit its introduction by the cold end (left-hand end in FIG. 2) into the tube. To this end, rod 32 is carried by a micrometer screw 34, screwed into a nut 36, fixed to a member 38 carrying tube 20 by columns 40.

In the represented variant, screw 34 has a split head **34*a* permitting the controlled introduction of rod 32 into tube 20** by means of an insulating tool, sealingly traversing the vacuum enclosure containing the source.

In another, not shown constructional variant, this introduction can take place automatically, e.g. with the aid of a stepping motor controlled by a processor. The sample of the solid material to be ionized 42 is deposited at the end by which the rod enters the tube (right-hand end in FIG. 2).

Figure 3:
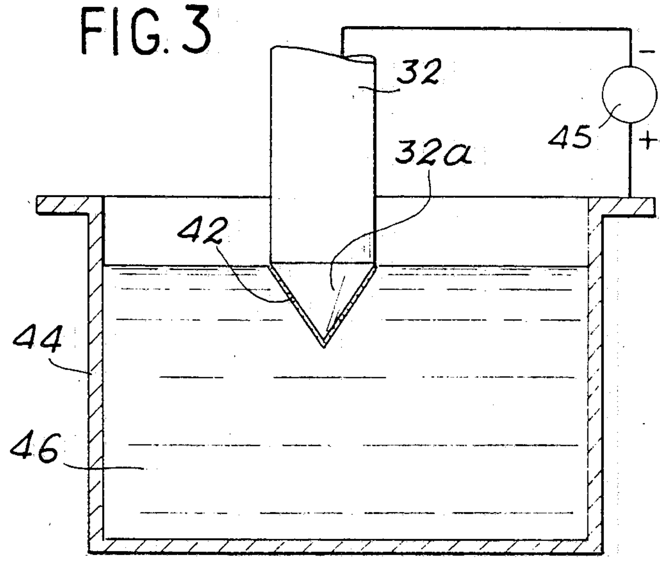
FIG. 3 in exemplified manner, the deposition of a solid material on a pointed end of a rod of the device of FIG. 2.

For this purpose, the end of the rod has a pointed shape in the represented variant. This shape makes it possible to proceed in a simple, rapid and perfectly controlled manner during the electrodeposition of material 42 and as shown in FIG. 3. For this purpose, it is merely necessary to introduce into a conductive electrolytic bath 44 a solution 46 of the material which it is wished to deposit on the end of rod 32 and to pass a current by means of a source 45 between the bath and the rod. It can in particular be a nitric solution of the material to be ionized. The pointed end **32*a* of the rod is immersed to a perfectly controlled depth in solution 46 and electrolysis is performed. Thus, a deposit 42 of the material to be ionized is obtained. In per se known manner, this deposit will be transformed into an oxide, as soon as it is raised to a temperature of a few hundred degrees C. in tube 20**.

In a not shown constructional variant, the material to be ionized can be fixed to an ion exchange resin ball. The end of rod 32 then has a different shape, which is characterized by a recess, e.g. a conical recess, in which is deposited the resin ball to which is fixed the material to be ionized.

It is obviously possible to use any other process for depositing the material on the end of the rod without passing beyond the scope of the invention. In all cases, it is pointed out that the device according to the invention makes it possible to easily deposit the material to be ionized, which is an important advance compared with the prior art devices.

To complete the description of the ionizing device according to FIG. 2, it should be noted that plate 22 is detachably fixed on support 48, in order to permit the replacement of the tube 20-plate 22 assembly following a manipulation, if this proves necessary. This makes it possible to prevent any risk of a following manipulation being impaired by a preceding manipulation.

Support 48, which is also made from an electricity conducting material, is fixed to member 38 by screws 52. Coil 26, shield 30 and terminals 28 are fitted in an insulating part 50 held in place by member 48.

Finally, the stainless steel fixed part 38 has a portion 38*a*, which covers the insulating part 50. Portion 38*a* is provided with a hole 54 in the extension of the right-hand end of the tube, by which the ions leave. Portion 38*a* thus forms the first electrode of the acceleration device 16 of FIG. 1.

The ionizing device 12 described hereinbefore with reference to FIG. 2, operates in the following way.

A sample of material is firstly deposited on the end of rod 32 by one of the processes described hereinbefore and the rod is mounted on screw 34. After introducing said assembly and, if appropriate, a tube 20 mounted on its plate 22, a vacuum is formed in the enclosure.

Before starting to introduce the end of rod 32 carrying sample 42, the opposite end of tube 20 is heated by means of the electron bombardment device 24. Initially this heating is at a low level, so that the walls of the tube can be degassed. It is then carried out at full power and the right-hand end of the tube 20 with reference to FIG. 2 is heated to a temperature of approximately 3000° C. (the temperature limit being fixed solely by the melting temperature of the tube).

When this temperature is reached, the cold end of rod 32 carrying sample 42 is introduced into the tube and the temperature does not exceed a few hundred degrees. Tube 20 in fact constitutes a tubular furnace or oven, along which a temperature gradient is established, which can range between approximately 300° C. and approximately 3000° C.

As the remainder of the apparatus is also functioning, the movement of the rod end carrying the sample is continued towards the hot end of the tube, until the formation of ions is detected by device 18 (FIG. 1). The displacement of the rod can be perfectly checked by the micrometer screw 34, or by any equivalent means. Thus, the progressive displacement of the sample can be continued until the ion current observed makes it possible to carry out an appropriate measurement. Rod 32 is then maintained in this position and the measurements are performed in the conventional way.

As a result of the device according to the invention, it is clear that producing a temperature gradient along tube 20, combined with the controlled displacement of the solid sample within the tube, makes it possible to effect a perfectly controlled ionization of this sample.

Moreover, the use of a heating means not formed by a Joule heating means, as well as the replacement of the filament of the known devices by stronger members (tube 20 and rod 32) make it possible to significantly increase the heating temperature and therefore the ion yield of the device.

It should also be noted that rod 32 forms a piston, which in operation seals the end of the tube opposite to the normal ion exit end, whilst the location of the heating means 24 in the immediate vicinity of said exit end increases the probability that an ion reevaporated by the tube surface will leave by this end. The intensity of this ion current and the ion yield are consequently also improved.

These advantages are confirmed by experience which shows that the ion yield of the device according to the invention is approximately 10 times higher than that of known devices using filaments heated by the Joule effect.

Moreover, the device according to the invention has the essential advantage of being adaptable, without difficulty, to the ionization of certain gaseous samples (e.g. uranium hexafluoride), which was not the case of the hitherto known devices for ionizing solid material.

Figure 4:
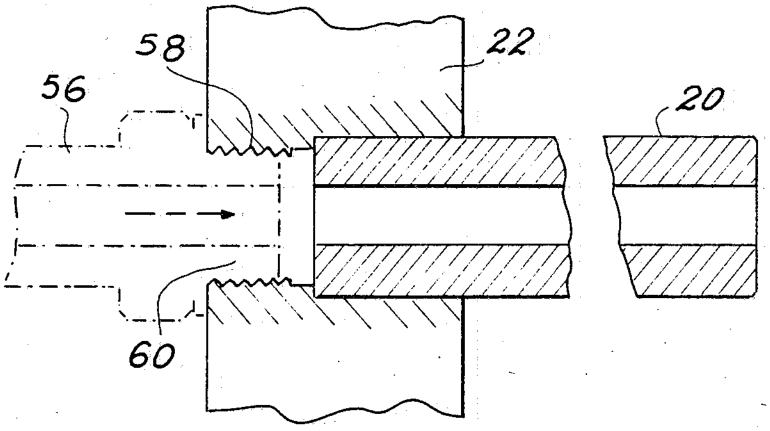
FIG. 4 a partial longitudinal sectional view showing how the device of FIG. 2 can be modified for carrying out the ionization of a gaseous material.

For this purpose, it is merely necessary to replace the rod 32 carrying the solid sample by a nozzle or duct 56, which is directly connected to the cold end of tube 20, as is diagrammatically shown in FIG. 4. For example, it is possible to see that plate 22 can have on the side of its outer face and in the extension of tube 20, a tapped hole 58 into which is screwed a pipe connection 60, when a measurement is to be carried out on a gaseous sample.

Duct 56 is then linked with means for injecting the gaseous sample, via a constriction having a regulatable cross-section, or by any equivalent device making it possible to control the flow rate of the gas injected into the tube. This not shown constriction has a function comparable to that of the micrometer screw 34 in the embodiment of FIG. 2. Thus, to obtain an ion current reaching the desired intensity, the constriction is gradually opened in order to increase the flow rate of the gas to be ionized.

In this application, the advantages of the device according to the invention with respect to the ion yield and intensity of the ion current are retained.

What is claimed is:

1. A device for thermally ionizing a solid material, comprising a tube open at its first and second ends, means for heating the first end of the tube to a temperature to affect thermal ionization of said material, the second end of the tube being kept at a relatively low temperature, so as to produce a temperature gradient between the said ends of the tube and means for introducing the material into the tube by the second end thereof comprising, a rod, at one end of which is deposited said material, and means for displacing said rod in a controlled manner within the tube, and means for detecting the resultant thermal ionization of the material.

2. A device according to claim 1, wherein the means for displacing the rod within the tube comprises a nut-screw system, whereof one of the elements is fixed and the other integral with the rod.

3. A device according to claim 1, wherein the said one end of the rod has a point, on which the material is deposited by electrodeposition.

4. A device according to claim 1, wherein the said end of the rod has a recess, in which is placed an ion exchange resin ball fixing the said material.

5. A device according to claim 1, wherein the means for heating the first end of the tube comprises an electron bombardment device.

6. A device according to claim 5, wherein the electron bombardment device comprises a coil surrounding the first end of the tube, means for supplying electricity to the coil and means for applying a potential difference between the coil and the tube.

7. A device according to claim 1, wherein the tube is mounted by its second end on an interchangeable fixed plate made from a conductive material.

* * * * *